(12) United States Patent
Rasalingam et al.

(10) Patent No.: US 11,948,924 B2
(45) Date of Patent: Apr. 2, 2024

(54) COMBINED SEMICONDUCTOR DEVICE PACKAGING SYSTEM

(71) Applicant: Western Digital Technologies, Inc., San Jose, CA (US)

(72) Inventors: Uthayarajan A L Rasalingam, Penang (MY); Toh Kok Wei, Penang (MY)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 167 days.

(21) Appl. No.: 17/339,409

(22) Filed: Jun. 4, 2021

(65) Prior Publication Data

US 2022/0392877 A1 Dec. 8, 2022

(51) Int. Cl.
*H01L 25/10* (2006.01)

(52) U.S. Cl.
CPC .... *H01L 25/105* (2013.01); *H01L 2225/1058* (2013.01)

(58) Field of Classification Search
CPC .......... H01L 25/105; H01L 2225/1058; H01L 25/0657; H01L 25/043; H01L 2924/15311; H01L 2924/181; H01L 25/0756; H01L 25/117
See application file for complete search history.

(56) References Cited

U.S. PATENT DOCUMENTS

| 2014/0312481 A1* | 10/2014 | Choi | ..................... H01L 25/105 438/109 |
| 2014/0361442 A1* | 12/2014 | Lee | ........................ H01L 25/105 257/777 |
| 2014/0367867 A1* | 12/2014 | Lin | ................... H01L 23/49816 257/777 |

* cited by examiner

*Primary Examiner* — Thanh Y. Tran
(74) *Attorney, Agent, or Firm* — Morgan, Lewis & Bockius LLP (57) ABSTRACT

A combined semiconductor device package includes a first semiconductor device package having a first semiconductor chip housed within a first enclosure, and a first substrate coupled to the first enclosure. The first substrate includes first solder balls and second solder balls, each in electrical communication with the first semiconductor chip. The first semiconductor device further includes conductive pads directly coupled to the first substrate. The conductive pads are in electrical communication with the first and second solder balls. The combined semiconductor device package further includes a second semiconductor device package having a second semiconductor chip housed within a second enclosure, and third solder balls in electrical communication with the second semiconductor chip, and coupled to the conductive pads of the first semiconductor device package. The combined semiconductor device package may be used for packaging a memory device that allows for increased memory package without increasing the package form factor.

19 Claims, 5 Drawing Sheets

COMBINED SEMICONDUCTOR DEVICE PACKAGING SYSTEM

BACKGROUND

The present disclosure generally relates to packaging for semiconductor memory devices (e.g., NAND flash devices) and manufacture thereof and, more particularly, to a package for a semiconductor memory device configured to simultaneously and directly couple to a substrate (e.g., printed circuit board) and another semiconductor memory device.

As products and computer technology that require large amounts of data storage such as, artificial intelligence (AI), internet of things (JOT), and autonomous vehicles, have become more popular, the demand for data storage space has increased exponentially. Semiconductor memory devices often include one or more semiconductor device packages, each including a semiconductor chip having an associated data storage capacity. The number of semiconductor packages, and thus the total storage capacity, that may be included on a single semiconductor memory device is limited by the physical size of the semiconductor memory device and heat dissipation requirements. Additionally, the physical size of semiconductor memory devices is typically limited by existing form factor requirements (e.g., dimensions of the printed circuit board, etc.).

Therefore, there is a need to increase the storage capacity of the semiconductor device without increasing the size of the semiconductor device.

SUMMARY

In one embodiment there is a combined semiconductor device package that includes a first semiconductor device package. The first semiconductor device package includes a first semiconductor chip housed within a first enclosure, a first substrate coupled to the first enclosure on a first side of the first substrate, the first substrate including a first plurality of solder balls and a second plurality of solder balls, the first plurality of solder balls and the second plurality of solder balls each in electrical communication with the first semiconductor chip, and a plurality of conductive pads directly coupled to the first substrate on a second side of the first substrate, the second side opposite the first side of the first substrate, the plurality of conductive pads in electrical communication with the first plurality of solder balls and the second plurality of solder balls. The combined semiconductor device package further includes a second semiconductor device package. The second semiconductor device package includes a second semiconductor chip housed within a second enclosure, and a third plurality of solder balls in electrical communication with the second semiconductor chip, the third plurality of solder balls coupled to the plurality of conductive pads of the first semiconductor device package.

In some embodiments, the first substrate is configured to electrically couple each of the first semiconductor chip and the second semiconductor chip to the first plurality of solder balls and the second plurality of solder balls. In some embodiments, the first plurality of solder balls and the second plurality of solder balls are positioned opposite regions about the first enclosure. In some embodiments, the plurality of conductive pads is positioned between the first plurality of solder balls and the second plurality of solder balls of the first substrate. In some embodiments the combined semiconductor device package further includes a second substrate that includes an opening and the combined semiconductor device package is configured to couple to the second substrate, the second enclosure being sized to extend through the opening in the printed circuit board.

In some embodiments, the first plurality of solder balls of the first substrate and second plurality of solder balls of the second substrate are configured to electrically couple the first semiconductor device package and the second semiconductor device package to the second substrate. In some embodiments, the first substrate includes a plurality of connecting elements electrically coupling the first semiconductor chip of the first semiconductor device package and the plurality of conductive pads of the first semiconductor device package to the first plurality of solder balls and the second plurality of solder balls of the first substrate. In some embodiments, the first substrate includes an inner portion positioned between the first enclosure of the first semiconductor device package and the plurality of conductive pads, and an outer portion extending around an outer edge of the inner portion and integrally formed with the inner portion. In some embodiments, the inner portion has a thickness which is less than a thickness of the outer portion. In some embodiments, the first enclosure of the first semiconductor device package and the second enclosure of the second semiconductor device package have generally the same width.

In another embodiment there is a combined semiconductor device package that includes first package means for electrically coupling one or more storage means. The first package means includes first enclosure means for housing a first storage means for providing a first data storage capacity, first substrate means for providing electrical communication to the first enclosure means, the first substrate means directly coupled to the first enclosure means and including a first contact means for transmitting to and receiving electrical signals from the first storage means, the first contact means in electrical communication with the first substrate means, and second contact means for providing electrical communication to the first contact means, the second contact means coupled to the first substrate means opposite the first enclosure means. The combined semiconductor device package further includes second package means for providing a second storage means for providing a second data storage capacity. The second package means includes second enclosure means for housing the second storage means, and third contact means for providing electrical communication to the second storage means, the third contact means electrically coupled to the second contact means such that the second storage means is in electrical communication with the first substrate means. In some embodiments, the first substrate means is configured to couple the first package means to a second substrate means. In some embodiments, the second electrical communication means includes one or more receiving means configured to receive at least one of the first packaging means and the second packaging means.

In another embodiment there is a semiconductor device that includes a combined semiconductor device package. The combined semiconductor device package includes a first semiconductor device package having a first semiconductor chip housed within a first enclosure, a first substrate coupled to the first enclosure on a first side of the first substrate, the first substrate including a first plurality of solder balls and a second plurality of solder balls, the first plurality of solder balls and the second plurality of solder balls each in electrical communication with the first semiconductor chip, and a plurality of conductive pads directly coupled to the first substrate on a second side of the first substrate, the second side opposite the first side of the first substrate, the plurality of conductive pads in electrical communication with the first plurality of solder balls and the second plurality of solder balls. The combined semiconductor device package further includes a second semiconductor device package having a second semiconductor chip housed within a second enclosure, and a third plurality of solder balls in electrical communication with the second semiconductor chip, the third plurality of solder balls coupled to the plurality of conductive pads of the first semiconductor device package. The semiconductor device further includes a second substrate having a top surface, a bottom surface opposite the top surface, and one or more openings extending from the top surface to the bottom surface, and the first plurality of solder balls and the second plurality of solder balls are coupled to the second substrate, and the second enclosure extends at least partially through a first opening of the one or more openings in the second substrate.

In some embodiments, the first substrate is configured to electrically couple the first semiconductor chip of the first semiconductor device package and the second semiconductor chip of the second semiconductor device package to the first plurality of solder balls and the second plurality of solder balls of the first semiconductor device package. In some embodiments, the plurality of conductive pads is positioned between the first plurality of solder balls and the second plurality of solder balls. In some embodiments, the first substrate includes an inner portion positioned between the first enclosure and the plurality of conductive pads, and an outer portion extending around an outer edge of the inner portion and integrally formed with the inner portion. In some embodiments, the first plurality of solder balls and second plurality of solder balls of the first semiconductor device package are coupled to the outer portion of the first substrate opposite one another. In some embodiments, the inner portion of the first substrate has a thickness which is less than a thickness of the outer portion of the first substrate. In some embodiments, the second substrate further includes a first plurality of conductive pads configured to electrically couple to the first plurality of solder balls of the first semiconductor device package, and a second plurality of conductive pads configured to electrically couple to the second plurality of solder balls of the first semiconductor device package, the first plurality of conductive pads positioned proximate a first side of the first opening of the one or more openings and the second plurality of conductive pads positioned proximate a second side of the first opening opposite the first side.

BRIEF DESCRIPTION OF THE DRAWINGS

The foregoing summary, as well as the following detailed description, will be better understood when read in conjunction with the appended drawings. For the purpose of illustrating the present disclosure, there are shown in the drawings embodiments which are presently preferred, wherein like reference numerals indicate like elements throughout. It should be noted, however, that aspects of the present disclosure can be embodied in different forms and thus should not be construed as being limited to the illustrated embodiments set forth herein. The elements illustrated in the accompanying drawings are not necessarily drawn to scale, but rather, may have been exaggerated to highlight the important features of the subject matter therein. Furthermore, the drawings may have been simplified by omitting elements that are not necessarily needed for the understanding of the disclosed embodiments.

In the drawings.

DETAILED DESCRIPTION

The present subject matter will now be described more fully hereinafter with reference to the accompanying Figures, in which representative embodiments are shown. The present subject matter can, however, be embodied in different forms and should not be construed as limited to the embodiments set forth herein. Rather, these embodiments are provided to describe and enable one of skill in the art.

Referring to FIGS. 1A-6 there is shown a system for providing a stacked semiconductor memory device structure within an opening of a printed circuit board. In some embodiments, the opening in the printed circuit board may extend through the thickness of the printed circuit board.

Figure 1A:
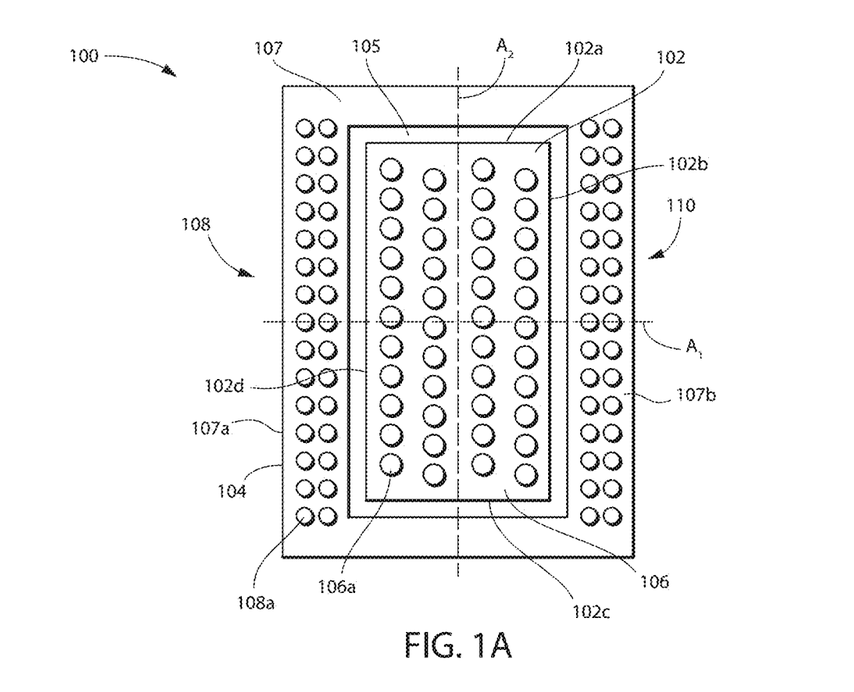
FIG. 1A is a bottom plan schematic view of a first package for a semiconductor memory device.
Figure 1B:
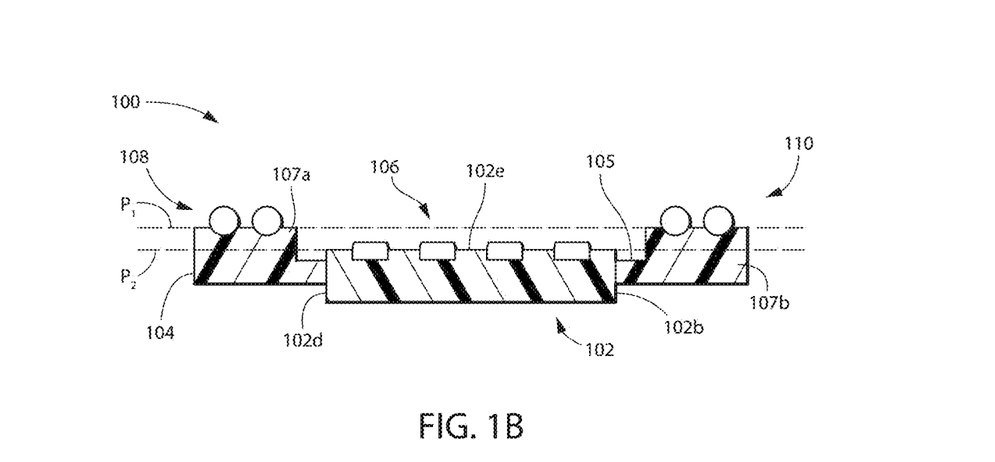
FIG. 1B is a side cross-sectional schematic view of the first package for the semiconductor memory device of FIG. 1A.

Referring to FIGS. 1A-1B, there is shown a first package for a semiconductor memory device (e.g., a NAND package), generally designated 100, in accordance with an exemplary embodiment of the present disclosure. The first package for the semiconductor memory device 100, also referred to as the first NAND package 100, may include an enclosure 102 for housing a first semiconductor memory chip (e.g., first NAND chip 103 shown in FIG. 1C), and a first substrate 104 coupled to the enclosure 102. The first substrate 104 may be directly coupled to enclosure 102. In some embodiments, the first substrate 104 is directly coupled to enclosure 102 and extends outwardly from walls 102a, 102b, 102c, and 102d of the enclosure 102. In some embodiments, enclosure 102 extends through first substrate 104 (see FIG. 1B). In other embodiments, first substrate 104 is coupled to a bottom surface 102e of enclosure 102 (see FIG. 1C). In some embodiments, the first NAND package 100 may include a plurality of conductive pads 106 in electrical communication with the first substrate 104. In some embodiments, the plurality of conductive pads 106 are arranged in an array on the bottom surface 102e of enclosure 102. For example, in the illustrated embodiment, the plurality of conductive pads may be arranged in a 4×11 array on the bottom surface 102e of enclosure 102. Different array sizes may be used in other embodiments. Each conductive pad of the plurality of conductive pads 106 may correspond to a different electrical input or output (e.g., power, memory, and/or control functionality) of a semiconductor memory device. For example, conductive pad 106a may be in electrical communication with a voltage input pin of a semiconductor memory device such that when a corresponding semiconductor memory device is coupled to the plurality of conductive pads 106, a voltage may be transmitted to the semiconductor memory device through conductive pad 106a. It will be understood that the functionality of each of the conductive pads of the plurality of the conductive pads 106 will not be described in detail for sake of brevity. In some embodiments, the plurality of conductive pads 106 may be a plurality of copper pads.

In some embodiments, the first substrate 104 may include an inner portion 105 and an outer portion 107 extending from the outer edges of the inner portion. In some embodiments, enclosure 102 may be directly coupled to inner portion 105. In some embodiments, the inner portion 105 may extend outwardly from walls 102a, 102b, 102c, and 102d of enclosure 102. In some embodiments, the inner portion 105 and outer portion 107 are integrally formed. In some embodiments, the outer portion 107 may have a thickness that is greater than a thickness of the inner portion 105. In other embodiments, the inner portion 105 and outer portion 107 may have generally the same thickness. The outer portion 107 may have coupled thereto, a plurality of solder balls configured to electrically couple the first NAND package 100 to a second substrate (e.g., a printed circuit board) separate and distinct from the first substrate 104, as discussed in more detail in FIG. 6. In some embodiments, a first plurality of solder balls 108 may be coupled to a first side 107a of the outer portion 107 and a second plurality of solder balls 110 may be coupled to a second side 107b of the outer portion 107. The first plurality of solder balls 108 may be arranged in an array that extends along first side 107a. The second plurality of solder balls 110 may be arranged in an array that extends along second side 107b. In some embodiments, the plurality of conductive pads 106, the first plurality of solder balls 108, and/or the second plurality of solder balls 110 may be positioned on the first NAND package 100 such that they face generally the same direction. For example, as shown in FIG. 1A, the plurality of conductive pads 106, the first plurality of solder balls 108 and second plurality of solder balls 110 all face outwardly from the first NAND package 100 in the same direction. In some embodiments, the first plurality of solder balls 108 and second plurality of solder balls 110 lie in a first plane $P_1$. In some embodiments, the plurality of conductive pads 106 lie in a second plane $P_2$. In some embodiments, plane $P_1$ is parallel to plane $P_2$. In some embodiments, plane $P_1$ is spaced from plane $P_2$. Each solder ball of the first plurality of solder balls 108 and second plurality of solder balls 110 may correspond to a different electrical input or output (e.g., power, memory, and/or control functionality) of a semiconductor memory device. For example, solder ball 108a may be in electrical communication with a voltage input of a semiconductor memory device such that a voltage may be transmitted through solder ball 108a to a corresponding voltage input pin of a semiconductor memory device in electrical communication with solder ball 108a.

Figure 1C:
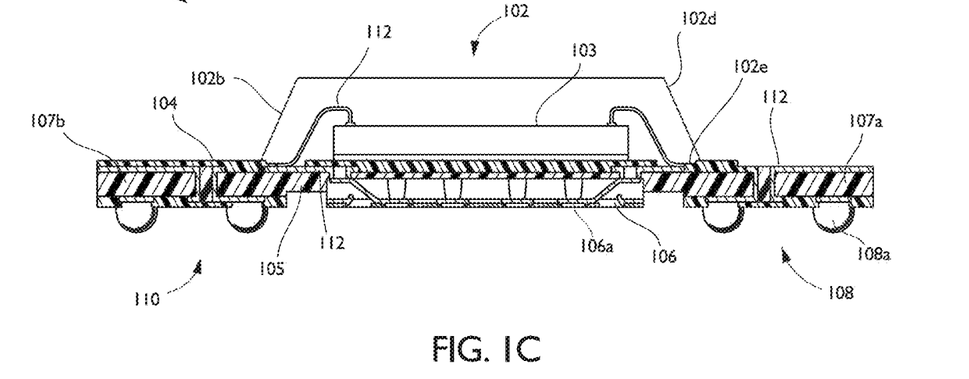
FIG. 1C is a side cross-sectional detailed view of the first package for the semiconductor memory device of FIG. 1A.

Referring to FIG. 1C, in some embodiments, the first plurality of solder balls 108 and/or second plurality of solder balls 110 may be in electrical communication with one or more of a semiconductor chip (e.g., first NAND chip 103) housed within enclosure 102 and the plurality of conductive pads 106. For example, solder ball 108a may be in electrical communication with conductive pad 106a and first NAND chip 103 via one or more connecting elements 112. In some embodiments, the one or more connecting elements 112 may be a plurality of electrically conductive wires and/or traces housed within enclosure 102 and/or first substrate 104. For example, the plurality of connecting elements 112 may extend within the first substrate 104 from one of the first side 107a or second side 107b of the outer portion 107 to the inner portion 105 or within enclosure 102 to electrically couple the plurality of solder balls 108 to the first NAND chip 103 and the plurality of conductive pads 106. The inner portion 105 may be positioned between the enclosure 102 and plurality of conductive pads 106. The inner portion 105 may have a thickness that is sized to allow one or more connecting elements of the plurality of connecting elements 112 to be disposed within the thickness of the inner portion 105. In FIG. 1C, there are a plurality of connecting elements 112 illustrated that extend within first substrate 104 that are not provided with a reference number in order to prevent overcrowding of the figure. However, it will be understood that any number of connecting elements 112 may extend throughout first substrate 104 such that each solder ball of the first and second plurality of solder balls 108, 110 is in electrical communication with at least one corresponding pin of the first NAND chip 103 and at least one conductive pad of the plurality of conductive pads 106.

Figure 2A:
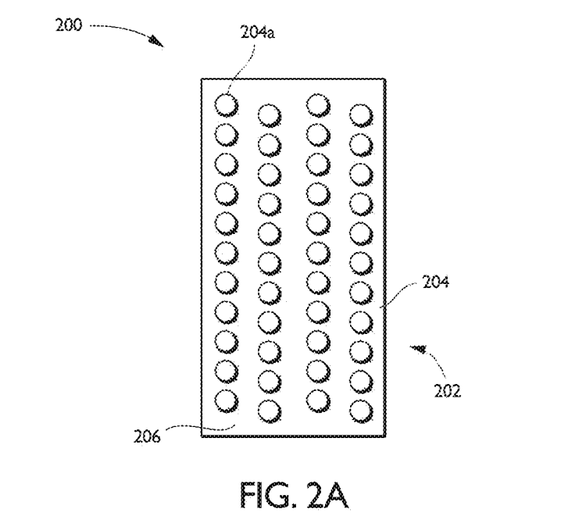
FIG. 2A is a bottom plan schematic view of a second package for a semiconductor memory device.
Figure 2B:
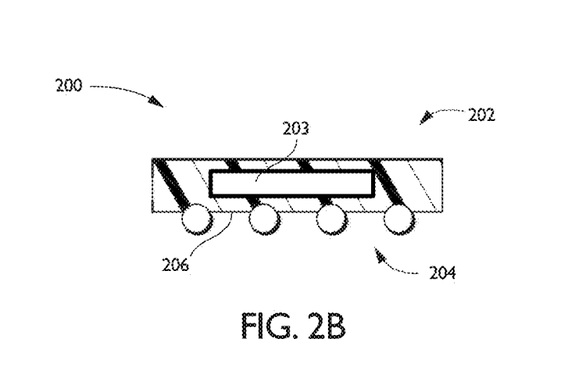
FIG. 2B is a side cross-sectional schematic view of the second package for a semiconductor memory device of FIG. 2A.

In some embodiments, the array of conductive pads 106 may be configured to couple a second NAND package to the first NAND package 100. Referring to FIGS. 2A-2B, there is shown a second NAND package, generally designated 200, in accordance with an exemplary embodiment of the present disclosure. The second NAND package 200 may include an enclosure 202 configured to house a second semiconductor memory chip 203 (e.g., a second NAND chip 203), not shown. The enclosure 202 may include a plurality of solder balls 204 in electrical communication with the second semiconductor memory chip 203 housed within enclosure 202. In some embodiments, the plurality of solder balls 204 may be arranged in an array of solder balls on the enclosure 202. In some embodiments, the plurality of solder balls 204 may be coupled to a bottom surface 206 of enclosure 202. Each solder ball included in the plurality of solder balls 204 may correspond to a different electrical input or output (e.g., power, memory, and/or control functionality) of a semiconductor memory device (e.g., the second NAND chip 203). For example, solder ball 204a may be in electrical communication with a voltage input pin of the second NAND chip 203 housed within enclosure 202 such that, a voltage may be transmitted to the second NAND chip 203 through conductive pad 106a.

In some embodiments, the plurality of solder balls 204 may be arranged on enclosure 202 such that they are configured to align with the plurality of conductive pads 106 of the first NAND package 100. In some embodiments, the plurality of solder balls 204 corresponding to the different electrical inputs and outputs of the second NAND chip may be arranged on enclosure 202 such that they are symmetrical with the corresponding electrical input and/or output of the plurality of conductive pads 106. For example, solder ball 204a and conductive pad 106a may both correspond to a voltage input. Solder ball 204a is positioned at the top left corner of the array formed of the plurality of solder balls 204, whereas conductive pad 106a is positioned at a bottom left corner of the array formed of the plurality of conductive pads 106. In this example, the plurality of solder balls 204 is symmetrical to the plurality of conductive pads 106 about a first axis $A_1$ of the first NAND package 100. In other embodiments, the plurality of solder balls 204 may be arranged on enclosure 202 such that they are symmetrical about axis $A_2$. For example, solder ball 204a may be positioned at the bottom right corner of the plurality of solder balls 204. In other embodiments, the plurality of solder balls 204 may be positioned on enclosure 202 in the same location corresponding to the plurality of conductive pads 106. For example, solder ball 204a may be positioned at the bottom left corner of the array formed of the plurality of solder balls 204.

Figure 3A:
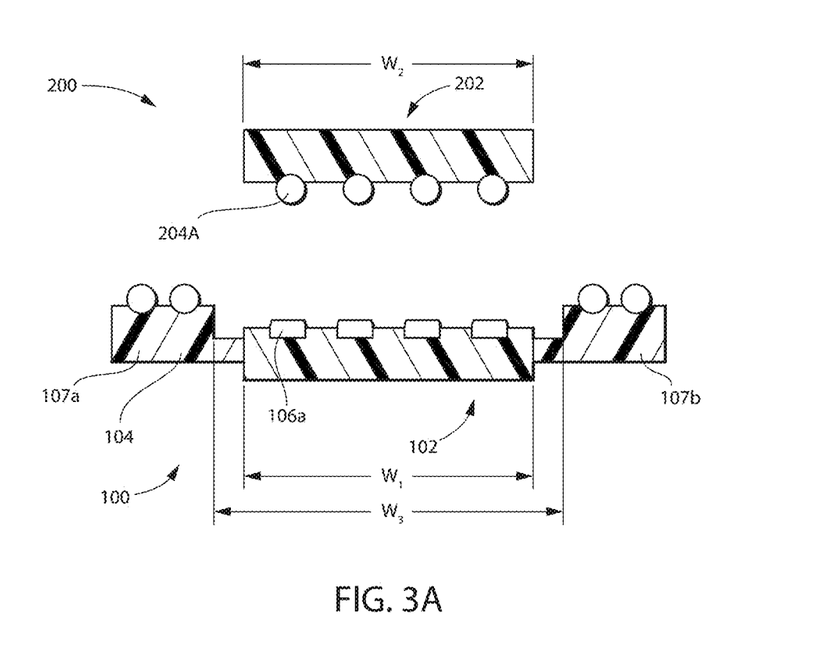
FIG. 3A is a side cross-sectional view of the first package of FIG. 1A and the second package of FIG. 1B spaced apart and aligned with one another.
Figure 3B:
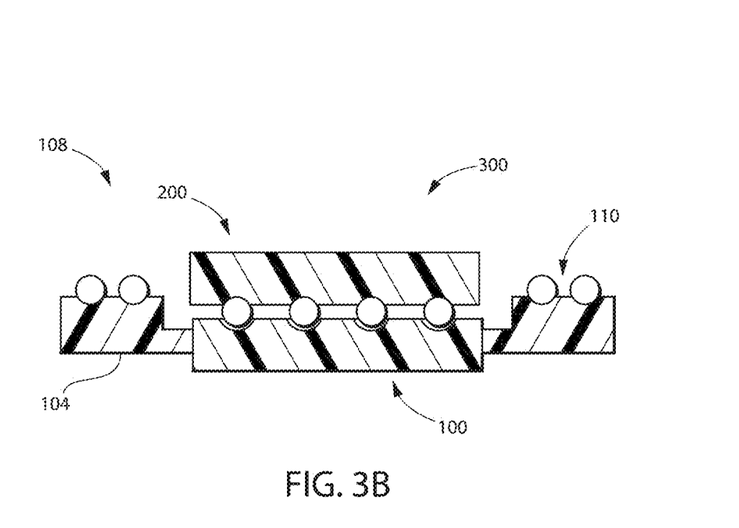
FIG. 3B is a side cross-sectional view of a combined semiconductor device package.

The placement of each solder ball of the plurality of solder balls 204 and the placement of each conductive pad of the plurality of conductive pads 106 may be arranged on the respective enclosure 102, 202 in any arrangement such that when the second NAND package 200 is coupled to the first NAND package 100, the solder balls and conductive pads, that correspond to the same electrical input or output, are directly coupled to one another. Referring to FIG. 3A-3B, there is shown an example of coupling the first NAND package 100 to the second NAND package 200. Referring to FIG. 3A, the second NAND package 200 is aligned with and positioned above the first NAND package 100. In this example, solder ball 204a is aligned with conductive pad 106a. In some embodiments, the width $W_2$ of enclosure 202 may be generally the same as the width $W_1$ of enclosure 102, as shown in FIG. 3A. In other embodiments, the width $W_2$ of enclosure 202 may be less than or greater than the width $W_1$ of enclosure 102. In some embodiments, the width $W_2$ of enclosure 202 may be less than the width $W_3$ between the first side 107a and second side 107b of the outer portion 107 of first substrate 104.

Referring to FIG. 3B, the second NAND package 200 and first NAND package 100 may be coupled together to form combined NAND package 300. In some embodiments, the second NAND package 200 may be coupled to the first NAND package 100 such that the second NAND package 200 is in electrical communication with the first substrate 104. In some embodiments, the second NAND package 200 may be coupled to the first NAND package by soldering the plurality of solder balls 204 to the plurality of conductive pads 106. In some embodiments, one or more of the first plurality of solder balls 108 and/or second plurality of solder balls 110 may be in electrical communication with the second NAND package 200. For example, the one or more connecting elements 112 disposed within the first substrate 104 may electrically couple the solder balls, directly coupled to the first substrate 104, to the second NAND package 200.

In some embodiments, the plurality of solder balls 204 of the second NAND package 200 electrically couple to the plurality of conductive pads 106 of the first NAND package 100 that, in turn, are connected via connecting elements 112 to the first and second plurality of solder balls 108 and 110. In some embodiments, the combined NAND package 300 may be configured to route signals from the first NAND chip 103 and second NAND chip housed within enclosure 202 to the first plurality of solder balls 108 and/or second plurality of solder balls 110. For example, signals from the second NAND chip within enclosure 202 may be routed from the plurality of conductive pads 106 through the inner portion 105 of the first substrate 104 via the connecting elements 112 out to the first and/or second plurality of solder balls 108, 110. The connecting elements 112 may connect to internal connections of the first NAND chip 103 such that signals from the first NAND chip 103 are routed through the inner portion 105 of the first substrate 104 via the connecting elements 112 out to the first and/or second plurality of solder balls 108, 110. In some embodiments, one or more signals from the first NAND chip 103 may be common with signals from the second NAND chip housed within enclosure 202. For example, power signals from the first NAND chip 103 and second NAND chip may be common. In some embodiments, one or more signals from the first NAND chip 103 may not be common with signals from the second NAND chip housed within enclosure 202. In some embodiments, the first NAND package 100 may have a first associated storage capacity measured in bytes (e.g. 256 gigabytes, 512 gigabytes, 1 terabyte) and the second NAND package 200 may have a second associated storage capacity (e.g. 256 gigabytes, 512 gigabytes, 1 terabyte). The combined NAND package 300 may have a storage capacity equivalent to the first associated storage capacity added with the second associated storage capacity.

Figure 4A:
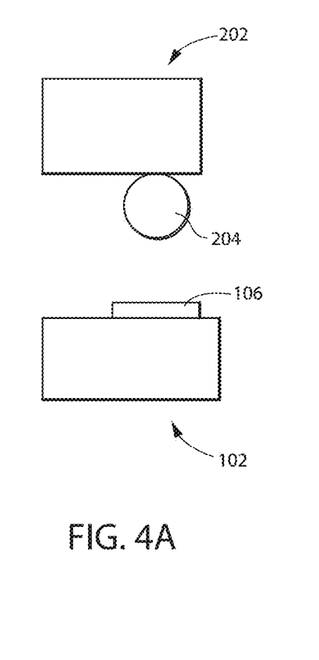
FIGS. 4A-4C are side cross-sectional views of electrical coupling means for the first and second package of FIGS. 1A and 2A.
Figure 4B:
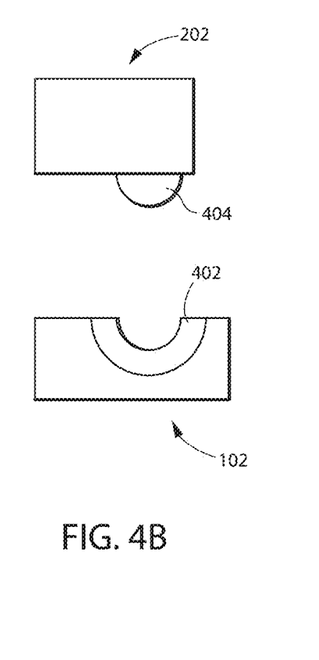
Figure 4C:
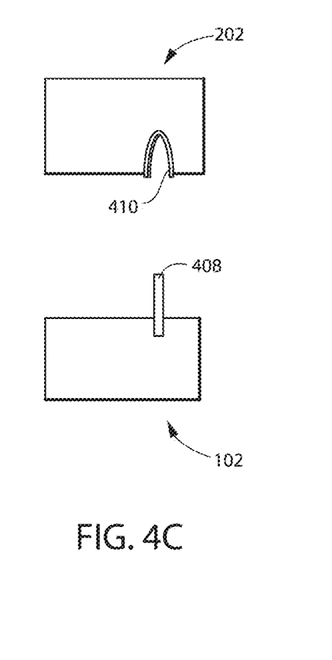

In the embodiments shown in FIGS. 1A-3B, the first NAND package 100 includes a plurality of conductive pads 106 and the second NAND package 200 includes a corresponding plurality of solder balls 204 configured to couple to the plurality of conductive pads 106. It will be understood, however, that the first NAND package 100 may include a plurality of solder balls instead of the plurality of conductive pads 106, and that the second NAND package 200 may include a corresponding plurality of conductive pads instead of the plurality of solder balls 204. In the examples described above, the solder balls may be generally spherical in shape and the conductive pads may be generally cylindrical in shape, as shown in FIG. 4A. In other embodiments, the solder balls 404 may be generally convex in shape and the conductive pads 402 may be generally concave, as shown in FIG. 4B. In other embodiments, the first NAND package 100 and second NAND package 200 may include a non-solder joint as shown in FIG. 4C instead of the plurality of solder balls 204 and plurality of conductive pads 106. For example, conductive pads 106 may be replaced by pins 408, and solder balls 204 may be replaced by holes or sockets 410 for receiving the pins 408, or vice versa. The sockets 410 and pins 408 may form a male and female type of connection with dry contacts such that the pins 408 may be coupled to and decoupled from sockets 410 by applying a mechanical force to one or more of the pins 408 and sockets 410. For example, enclosure 202 having sockets 410 may be pressed onto or pulled away from enclosure 102 having pin 408 or vice versa.

Figure 5A:
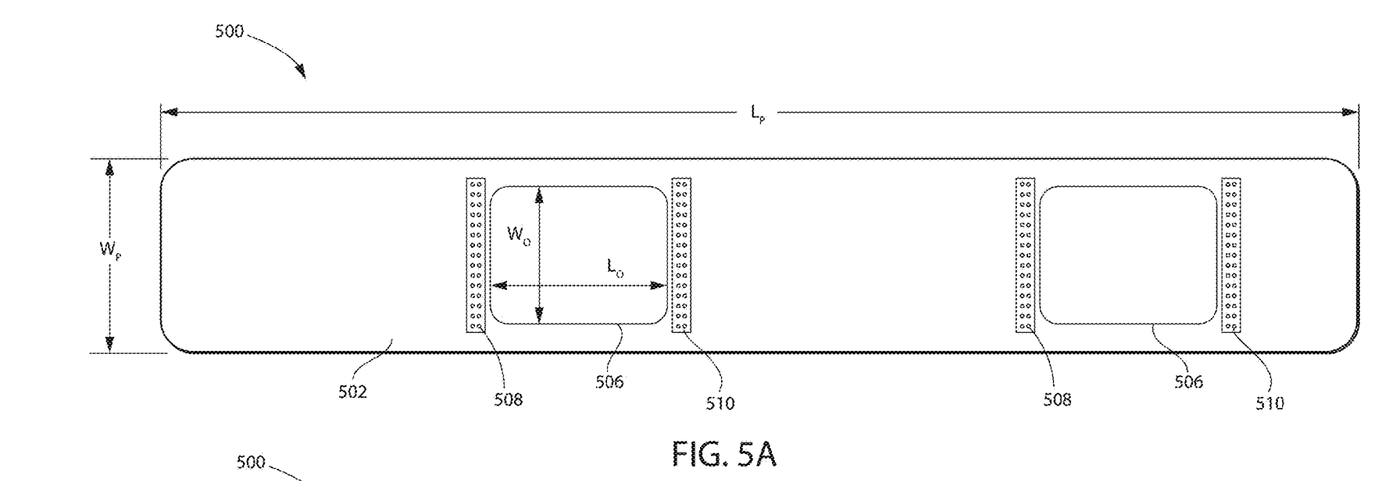
FIG. 5A is a top plan schematic view of a substrate for receiving a combined semiconductor device package.
Figure 5B:
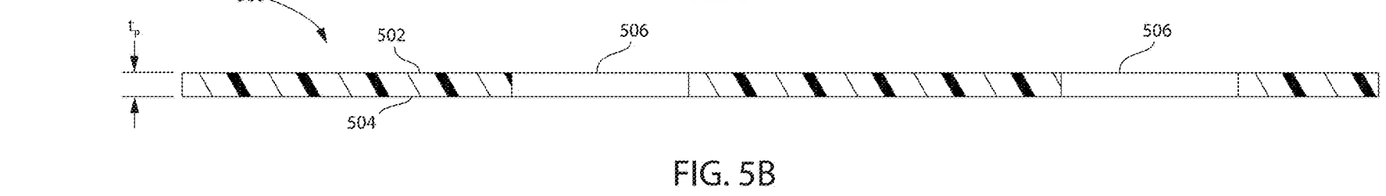
FIG. 5B is a side cross-sectional view of the substrate of FIG. 5A.

The combined NAND package 300 may be configured to couple to a substrate (e.g., a printed circuit board) of a computer storage medium device (e.g., a semiconductor storage device, solid-state storage drive). Referring to FIGS. 5A-5B, there is shown a second substrate, generally designated 500, configured to receive the combined NAND package 300. In some embodiments, the second substrate 500 may be a printed circuit board. In some embodiments, the second substrate 500 has a length $L_p$ and a width $W_p$ that conform to an existing form factor dimensions (e.g., M.2, mSATA, U.2, NF1, XFMEXPRESS, EDSFF, NVM Express, PCI Express) for a NAND flash device. The second substrate 500 may conform to any form factor for semiconductor storage devices or any form factors for substrate applications (e.g., printed circuit board applications) where other electronic devices that include common signals and functions (e.g., dynamic random-access memory, static random-access memory, application-specific integrated circuitry) are paired on said substrate. In some embodiments, one or more of the length $L_p$ and width $W_p$ may not conform to an existing form factor dimension. The second substrate 500 may have a top surface 502 and a bottom surface 504 disposed opposite the top surface. The second substrate 500 may include one or more openings 506 extending from the top surface 502 to the bottom surface 504 through the thickness $t_p$ of the second substrate 500. The openings 506 may allow the combined NAND package 300 to be coupled to second substrate 500 such that a portion of NAND package 300 extends through opening 506. By providing openings 506 in that a portion of combined NAND package 300 may extend through, the combined NAND package 300 may be coupled to second substrate 500 without requiring that second substrate 500 be enlarged beyond an existing form factor dimensions. The one or more openings 506 may be sized such that one or more of enclosure 102 and/or enclosure 202 may pass through the opening 506. For example, the one or more openings 506 may have a width $W_o$ and a length $L_o$ that is greater than or equal to the width and length of the enclosures 102, 202. In some embodiments, the one or more openings 506 are sized such that the first substrate 104 of the first NAND package 100 may not pass through the opening 506. For example, the width $W_o$ and length $L_o$ of the opening 506 may be less than the width and length of the outer portion 107 of first substrate 104.

In some embodiments, the second substrate 500 includes a plurality of conductive pads coupled to the second substrate 500 proximate each opening 506 for receiving the solder balls of the first substrate 104. In some embodiments, there is a first plurality of conductive pads 508 coupled to the second substrate 500 proximate a left sidewall of opening 506. In some embodiments, there is a second plurality of conductive pads 510 coupled to the second substrate 500 proximate a right sidewall of opening 506. In some embodiments, the first plurality of conductive pads 508 and second plurality of conductive pads 510 are configured to receive the first plurality of solder balls 108 and second plurality of solder balls 110 to electrically couple the combined NAND package 300 to second substrate 500. In the embodiment shown in FIGS. 5A-5B, the second substrate 500 includes two openings 506. In other embodiments, the second substrate 500 may include fewer than or more than two openings (e.g., one opening, three openings, four openings, five openings) depending on the size of the second substrate 500 and the size of the corresponding combined NAND package 300.

Figure 6:
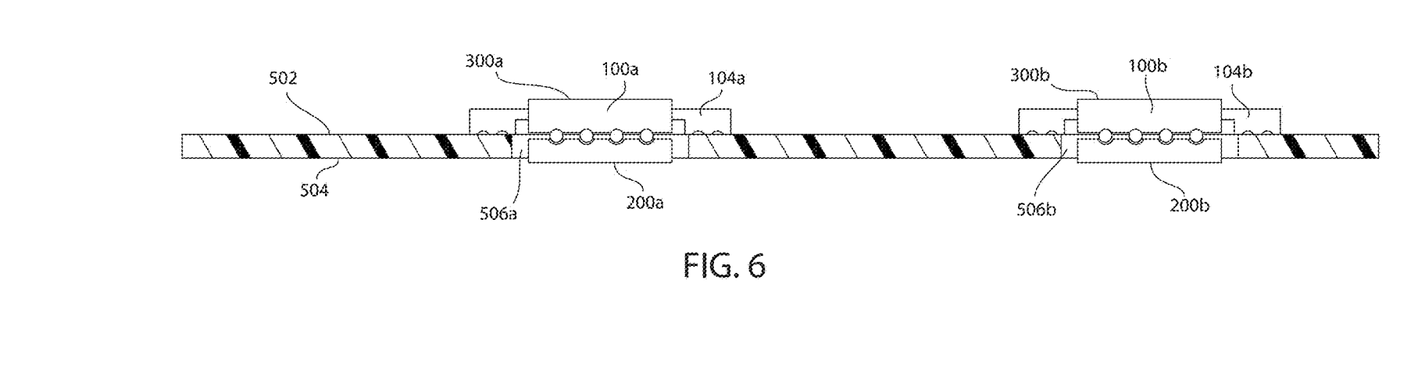
FIG. 6 is a side cross-sectional view of the substrate of FIG. 5A having coupled thereto the combined semiconductor device package of FIG. 3B.

Referring to FIG. 6, there is shown a side cross-sectional view of second substrate 500 having coupled thereto, two combined NAND packages 300a, and 300b. In some embodiments, each combined NAND package 300a, and 300b, at least partially extends through a corresponding opening 506a, and 506b in the PCB 500. In some embodiments, the first substrate 104a, 104b of the first NAND package 100a, 100b, electrically and mechanically couples to the conductive pads disposed proximate openings 506a, and 506b respectively. In some embodiments, the second NAND package 200a, 200b, is positioned within opening 506a, and 506b respectively, and extends outwardly from a bottom surface 504 of second substrate 500. In other embodiments, the second NAND package 200a, 200b is positioned within opening 506a, and 506b respectively, and does not extend outwardly from the bottom surface 504 of second substrate 500.

In the embodiment shown in FIG. 6, there are a total of four NAND packages 100a, 100b, 200a, 200b, each housing a separate and distinct NAND chip having an associated storage capacity. The PCB 500 may be used in a NAND flash storage device (e.g., an M.2 form factor solid state drive) such that the storage capacity of the NAND flash storage device would equal the combined total of the storage capacities of NAND packages 100a, 100b, 200a, and 200b. Coupling combined NAND packages 300a, 300b to PCB 500 in this manner may provide the total storage capacity of four NAND packages within an area on PCB 500 that would, in conventional NAND flash storage devices, be used to house two NAND packages. Additionally, the combined NAND packages 300a, 300b being coupled to second substrate 500 in this manner may reduce the signal trace length required along second substrate 500 to interface with four NAND packages, thereby reducing signal latency.

It will be appreciated by those skilled in the art that changes could be made to the exemplary embodiments shown and described above without departing from the broad inventive concepts thereof. It is understood, therefore, that this invention is not limited to the exemplary embodiments shown and described, but it is intended to cover modifications within the spirit and scope of the present invention as defined by the claims. For example, specific features of the exemplary embodiments may or may not be part of the claimed invention and various features of the disclosed embodiments may be combined. The words "right", "left", "lower" and "upper" designate directions in the drawings to which reference is made. The words "inwardly" and "outwardly" refer to directions toward and away from, respectively, the geometric center of the ball grid array having a multi-surface trace interface. Unless specifically set forth herein, the terms "a", "an" and "the" are not limited to one element but instead should be read as meaning "at least one".

It is to be understood that at least some of the figures and descriptions of the invention have been simplified to focus on elements that are relevant for a clear understanding of the invention, while eliminating, for purposes of clarity, other elements that those of ordinary skill in the art will appreciate may also comprise a portion of the invention. However, because such elements are well known in the art, and because they do not necessarily facilitate a better understanding of the invention, a description of such elements is not provided herein.

Further, to the extent that the methods of the present invention do not rely on the particular order of steps set forth herein, the particular order of the steps should not be construed as limitation on the claims. Any claims directed to the methods of the present invention should not be limited to the performance of their steps in the order written, and one skilled in the art can readily appreciate that the steps may be varied and still remain within the spirit and scope of the present invention.

What is claimed is:

1. A combined semiconductor device package comprising:
    a first semiconductor device package comprising:
        a first semiconductor chip housed within a first enclosure;
        a first substrate coupled to the first enclosure on a first side of the first substrate, the first substrate including a first plurality of solder balls and a second plurality of solder balls, the first plurality of solder balls and the second plurality of solder balls each in electrical communication with the first semiconductor chip; and
        a plurality of conductive pads directly coupled to the first substrate on a second side of the first substrate, the second side opposite the first side of the first substrate, the plurality of conductive pads in electrical communication with the first plurality of solder balls and the second plurality of solder balls;

a second semiconductor device package comprising:
  a second semiconductor chip housed within a second enclosure; and
  a third plurality of solder balls in electrical communication with the second semiconductor chip, the third plurality of solder balls coupled to the plurality of conductive pads of the first semiconductor device package; and
a second substrate including an opening,
wherein the first and second semiconductor device packages are configured to couple to the second substrate, the second enclosure being sized to extend through the opening in the second substrate.

2. The combined semiconductor device package of claim 1, wherein the first substrate is configured to electrically couple each of the first semiconductor chip and the second semiconductor chip to the first plurality of solder balls and the second plurality of solder balls.

3. The combined semiconductor device package of claim 1, wherein the first plurality of solder balls and the second plurality of solder balls are positioned opposite regions about the first enclosure.

4. The combined semiconductor device package of claim 1, wherein the plurality of conductive pads is positioned between the first plurality of solder balls and the second plurality of solder balls of the first substrate.

5. The combined semiconductor device package of claim 1, wherein the first plurality of solder balls of the first substrate and second plurality of solder balls of the first substrate are configured to electrically couple the first semiconductor device package and the second semiconductor device package to the second substrate.

6. The combined semiconductor device package of claim 1, wherein the first substrate includes a plurality of connecting elements electrically coupling the first semiconductor chip of the first semiconductor device package and the plurality of conductive pads of the first semiconductor device package to the first plurality of solder balls and the second plurality of solder balls of the first substrate.

7. The combined semiconductor device package of claim 1, wherein the first substrate includes an inner portion positioned between the first enclosure of the first semiconductor device package and the plurality of conductive pads, and an outer portion extending around an outer edge of the inner portion and integrally formed with the inner portion.

8. The combined semiconductor device package of claim 7, wherein the inner portion has a thickness which is less than a thickness of the outer portion.

9. The combined semiconductor device package of claim 1, wherein the first enclosure of the first semiconductor device package and the second enclosure of the second semiconductor device package have generally the same width.

10. A combined semiconductor device package comprising:
first package means for electrically coupling one or more storage means comprising:
  first enclosure means for housing a first storage means for providing a first data storage capacity;
  first substrate means for providing electrical communication to the first storage means, the first substrate means directly coupled to the first enclosure means and including a first contact means for transmitting to and receiving electrical signals from the first storage means, the first contact means in electrical communication with the first substrate means; and
  second contact means for providing electrical communication to the first contact means, the second contact means coupled to the first substrate means opposite the first enclosure means;
second package means for providing a second storage means for providing a second data storage capacity, the second package means comprising:
  second enclosure means for housing the second storage means; and
  third contact means for providing electrical communication to the second storage means, the third contact means electrically coupled to the second contact means such that the second storage means is in electrical communication with the first substrate means; and
a second substrate means for providing electrical communication to the first substrate means, the second substrate means including an opening,
wherein the first and second package means is configured to couple to the second substrate means, the second enclosure means being sized to extend through the opening in the second substrate means.

11. The combined semiconductor device package of claim 10, wherein the first substrate means is configured to couple the first package means to the second substrate means.

12. The combined semiconductor device package of claim 11, wherein the second substrate means includes one or more receiving means configured to receive at least one of the first packaging means and the second packaging means.

13. A semiconductor device comprising:
a combined semiconductor device package comprising:
  a first semiconductor device package comprising:
    a first semiconductor chip housed within a first enclosure;
    a first substrate coupled to the first enclosure on a first side of the first substrate, the first substrate including a first plurality of solder balls and a second plurality of solder balls, the first plurality of solder balls and the second plurality of solder balls each in electrical communication with the first semiconductor chip; and
    a plurality of conductive pads directly coupled to the first substrate on a second side of the first substrate, the second side opposite the first side of the first substrate, the plurality of conductive pads in electrical communication with the first plurality of solder balls and the second plurality of solder balls; and
  a second semiconductor device package comprising:
    a second semiconductor chip housed within a second enclosure; and
    a third plurality of solder balls in electrical communication with the second semiconductor chip, the third plurality of solder balls coupled to the plurality of conductive pads of the first semiconductor device package; and
  a second substrate having a top surface, a bottom surface opposite the top surface, and one or more openings extending from the top surface to the bottom surface,
  wherein the first plurality of solder balls and the second plurality of solder balls are coupled to the second substrate, and the second enclosure extends at least partially through a first opening of the one or more openings in the second substrate.

14. The semiconductor device of claim 13, wherein the first substrate is configured to electrically couple the first semiconductor chip of the first semiconductor device package and the second semiconductor chip of the second semiconductor device package to the first plurality of solder balls and the second plurality of solder balls of the first semiconductor device package.

15. The semiconductor device of claim 13, wherein the plurality of conductive pads is positioned between the first plurality of solder balls and the second plurality of solder balls.

16. The semiconductor device of claim 13, wherein the first substrate includes an inner portion positioned between the first enclosure and the plurality of conductive pads, and an outer portion extending around an outer edge of the inner portion and integrally formed with the inner portion.

17. The semiconductor device of claim 16, wherein the first plurality of solder balls and second plurality of solder balls of the first semiconductor device package are coupled to the outer portion of the first substrate opposite one another.

18. The semiconductor device of claim 16, wherein the inner portion of the first substrate has a thickness which is less than a thickness of the outer portion of the first substrate.

19. The semiconductor device of claim 13, wherein the second substrate further includes a first plurality of conductive pads configured to electrically couple to the first plurality of solder balls of the first semiconductor device package, and a second plurality of conductive pads configured to electrically couple to the second plurality of solder balls of the first semiconductor device package, the first plurality of conductive pads positioned proximate a first side of the first opening of the one or more openings and the second plurality of conductive pads positioned proximate a second side of the first opening opposite the first side.

\* \* \* \* \*